US009425108B1

(12) United States Patent
Pranatharthiharan et al.

(10) Patent No.: US 9,425,108 B1
(45) Date of Patent: Aug. 23, 2016

(54) METHOD TO PREVENT LATERAL EPITAXIAL GROWTH IN SEMICONDUCTOR DEVICES

(71) Applicant: International Business Machines Corporation, Armonk, NY (US)

(72) Inventors: Balasubramanian Pranatharthiharan, Watervliet, NY (US); Hui Zang, Guilderland, NY (US)

(73) Assignees: International Business Machines Corporation, Armonk, NY (US); GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/960,378

(22) Filed: Dec. 5, 2015

(51) Int. Cl.
| | | |
|---|---|---|
| H01L 21/84 | (2006.01) | |
| H01L 29/66 | (2006.01) | |
| H01L 21/304 | (2006.01) | |
| H01L 21/306 | (2006.01) | |
| H01L 21/3105 | (2006.01) | |
| H01L 21/02 | (2006.01) | |
| H01L 21/225 | (2006.01) | |
| H01L 29/78 | (2006.01) | |
| H01L 21/8234 | (2006.01) | |
| H01L 21/8238 | (2006.01) | |

(52) U.S. Cl.
CPC .......... *H01L 21/845* (2013.01); *H01L 21/0217* (2013.01); *H01L 21/02247* (2013.01); *H01L 21/2253* (2013.01); *H01L 21/3043* (2013.01); *H01L 21/30604* (2013.01); *H01L 21/31051* (2013.01); *H01L 21/823431* (2013.01); *H01L 21/823821* (2013.01); *H01L 29/6656* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,519,476 B2 | 8/2013 | Chen | |
| 8,569,152 B1 * | 10/2013 | Basker | H01L 29/66795 257/328 |
| 8,637,931 B2 | 1/2014 | Basker | |
| 8,691,640 B1 * | 4/2014 | LiCausi | H01L 29/66795 257/E21.421 |
| 8,878,300 B1 | 11/2014 | Liu | |
| 8,981,493 B2 | 3/2015 | Cheng | |
| 9,070,742 B2 | 6/2015 | Xie | |
| 2007/0057325 A1 * | 3/2007 | Hsu | H01L 29/785 257/347 |
| 2013/0052801 A1 * | 2/2013 | Berliner | H01L 21/845 438/468 |
| 2013/0168771 A1 * | 7/2013 | Wu | H01L 27/1211 257/351 |
| 2013/0230958 A1 * | 9/2013 | Lee | H01L 21/823431 438/283 |
| 2013/0244392 A1 * | 9/2013 | Oh | H01L 29/66477 438/299 |
| 2013/0270641 A1 * | 10/2013 | Chi | H01L 21/823821 257/351 |
| 2015/0056792 A1 | 2/2015 | Adam | |
| 2015/0111362 A1 * | 4/2015 | Shieh | H01L 21/823431 438/424 |

FOREIGN PATENT DOCUMENTS

JP 2010093012 A 4/2010

* cited by examiner

*Primary Examiner* — Michael Jung
(74) *Attorney, Agent, or Firm* — Jeffrey S. LaBaw; Steven J Meyers (57) ABSTRACT

A method for preventing epitaxial growth in a semiconductor device is described. The method includes cutting the fins of FinFET structure to form a set of exposed fin ends. A set of sidewall spacers are formed on the set of exposed fin ends, forming a set of spacer covered fin ends. The set of sidewall spacers prevent epitaxial growth at the set of spacer covered fin ends. A semiconductor device includes a set of fin structures having a set of fin ends. A set of inhibitory layers are disposed at the set of fin ends to inhibit excessive epitaxial growth at the fin ends.

16 Claims, 7 Drawing Sheets

METHOD TO PREVENT LATERAL EPITAXIAL GROWTH IN SEMICONDUCTOR DEVICES

BACKGROUND OF THE INVENTION

This disclosure relates to integrated circuit devices, and more specifically, to a method and structure to prevent epitaxial growth in semiconductor devices.

As the dimensions of modern integrated circuitry in semiconductor chips continue to shrink, conventional semiconductor processing is increasingly challenged to make structures at finer dimensions. Planar field effect transistor (FET) technology has become constrained at smaller geometries due to leakage effects. The semiconductor industry has found an alternative approach to planar FETs with fin field effect transistors (FinFETs) to reduce leakage current in semiconductor devices. In a FinFET, an active region including the drain, the channel region and the source protrudes up from the surface of the semiconductor substrate upon which the FinFET is located. Due to the many superior attributes, especially in the areas of device performance, off-state leakage and foot print, FinFETs are replacing planar FETs, to enable the scaling of gate lengths to 14 nm and below. In addition, a type of FinFET called a multiple gate field-effect transistor, or MuGFET, is often used in logic devices.

A typical static random-access memory (static RAM or SRAM)), when implemented in FinFETs, is comprised of three different types of FinFETs: pull-up (PU) FinFETs, pass-gate (PG) FinFETs, and pull-down (PD) FinFETs. In dimensions of 14 nm and below, the pull up FinFET active distance is one of factors which limit the density of the integrated circuit. The PU FinFET to PU FinFET epitaxy short is an SRAM and logic device yield issue.

BRIEF SUMMARY

According to this disclosure, a structure and method for constructing the structure are described. In one aspect of the invention, a method for preventing epitaxial growth in a semiconductor device includes cutting the fins of FinFET structure to form a set of exposed fin ends. A set of sidewall spacers are formed on the set of exposed fin ends, forming a set of spacer covered fin ends. The set of sidewall spacers prevent epitaxial growth at the set of spacer covered fin ends. In another aspect of the invention, a semiconductor device includes a set of fin structures having a set of fin ends. A set of inhibitory layers are disposed at the set of fin ends to inhibit excessive epitaxial growth at the fin ends.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

At a high level, the invention includes a structure and method for fabricating the structure for preventing excessive epitaxial growth on the fin end of a FinFET device, e.g., both for logic FinFETs or for a pull-up FinFET or pFinFET in SRAM. A sidewall spacer is fabricated at the fin end to prevent the silicon of the fin end from providing a "seed" for epitaxial growth at the fin end where it is not needed, while allowing epitaxial silicon to grow on the fin sides for the source and drain of the FinFET. In an alternative embodiment, the exposed fin end is treated with plasma nitridation and/or high dose implantation processes to create an inhibitory layer to prevent epitaxial growth at the fin end.

A "substrate" as used herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall structures. The sidewall structures can be used as masking structures for further semiconducting processing steps.

While the invention applies to a static random-access memory (SRAM) formed of fin field effect transistors (FinFETs), embodiments of the invention may also be applied to a variety of semiconductor devices. Static random-access memory (SRAM) is a type of volatile semiconductor memory that uses bistable latching circuitry to store each bit. Typically, each bit in an SRAM is stored on four transistors, two pull-up (PU) transistors and two pull-down (PD) transistors that form two cross-coupled inverters. This memory cell has two stable states which are used to denote 0 and 1. Two additional access transistors or pass-gate transistors control the access to a storage cell during read and write operations. Typically, the pulldown and pass-gate transistors are n-channel FETs or nFETs and the pull-down transistors are p-Channel FETs or pFETs. When the SRAMs are built with FinFET structures, the PD and PG transistors are nFinFETs and the PU transistors are pFinFETs.

Embodiments will be explained below with reference to the accompanying drawings.

Figure 1:
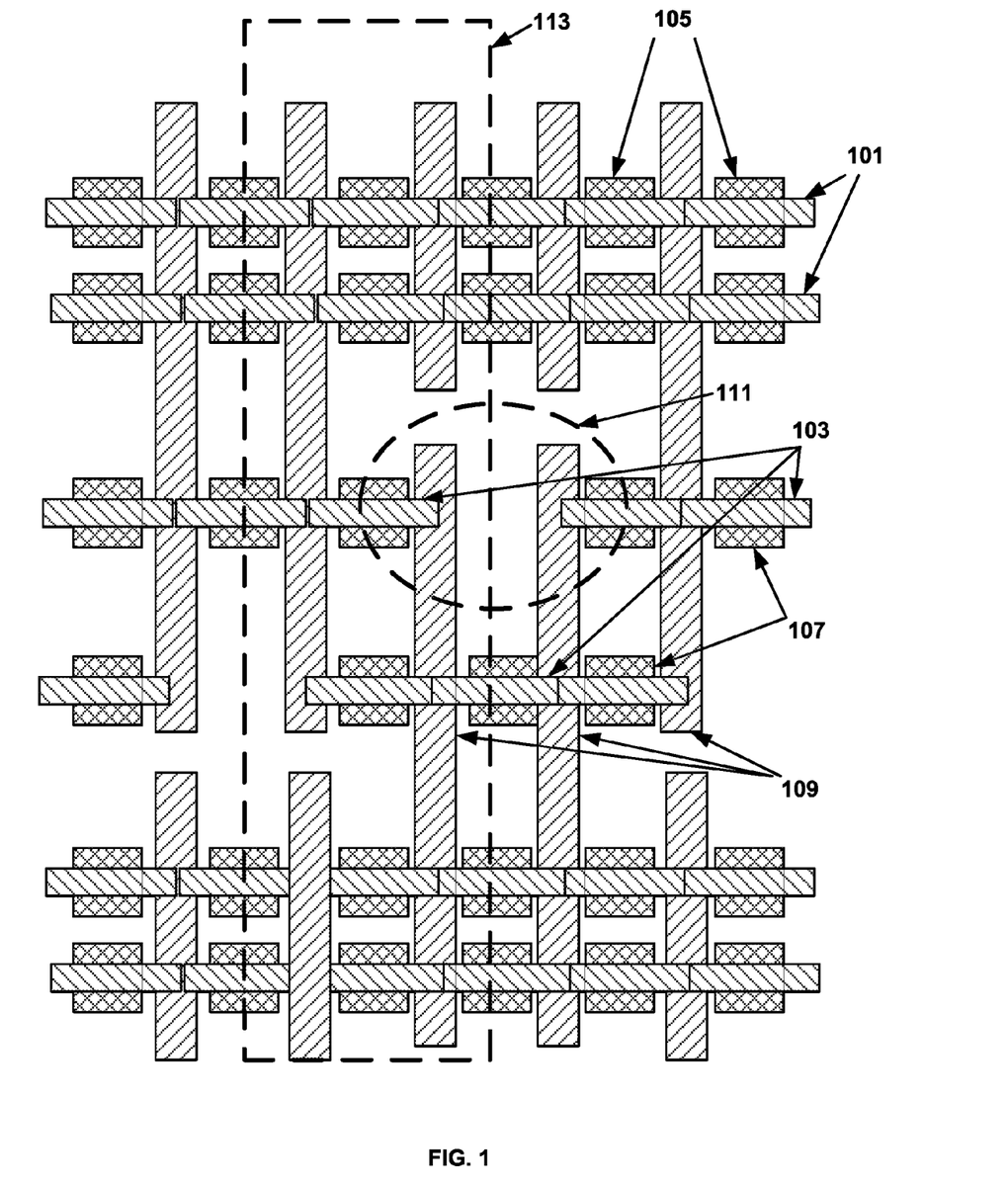
FIG. 1 is a top view of an SRAM device comprised of a plurality of FinFETs.

FIG. 1 is a top view of an SRAM device comprised of a plurality of FinFETs. The rows of the fins of PD and PG devices 101 and rows of the fins of the PU devices 103 are shown. The source and drain of the nFinFETs 105 and the source and drain of the pFinFETs 107 are created in part by an epitaxial step. The regions 109 indicate the positions of the gates which can be fabricated of polysilicon or metal. The epitaxial growth step is used to create an increased volume of silicon for the source and drain which grow on the fins 101, 103 to create the nFinFETs epitaxial regions 105 and the pFinFETs epitaxial regions 107. Epitaxy is a deposition of a crystalline overlayer on a crystalline substrate. The fins, being composed of silicon, act as a "seed" for the epitaxial regions. The problem which the invention improves is that at the ends of the pFinFETs, see for example region 111, during the epitaxial growth step, excess epitaxial silicon is grown where it is not desired. The excess growth causes shorts, reducing yield and presents a limiting factor in reducing the geometry of the SRAM circuit. This problem occurs where the fin is "cut" to create a pair of FinFETs or individual FinFETs from a long fin. The dashed box 113 indicates the FinFETs which comprise a single SRAM circuit.

Figure 2:
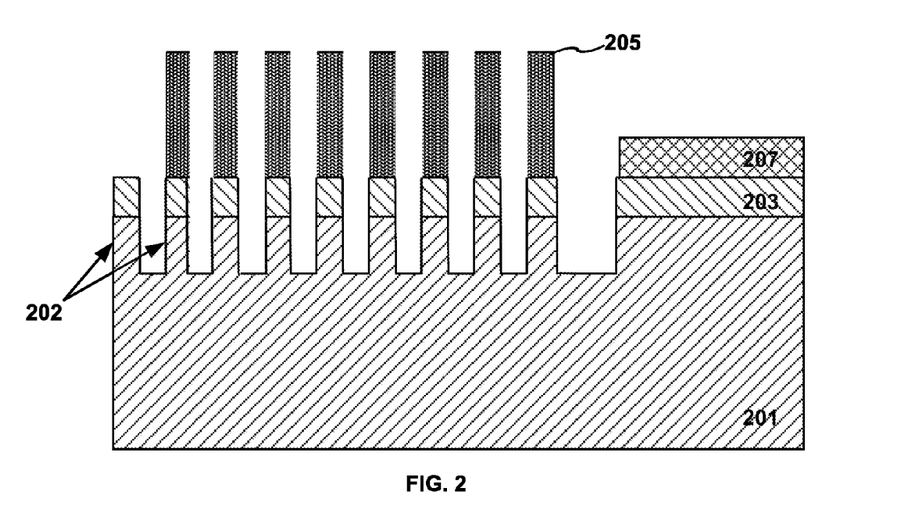
FIG. 2 is a cross-sectional diagram depicting fin formation in the process of fabricating a FinFET according to a first embodiment of the invention.

FIG. 2 is a cross-sectional diagram depicting fin formation in the process of fabricating a FinFET according to a first embodiment of the invention. FIG. 2 illustrates a point in the process after fin etch to form fin structures in the FinFET devices of FIG. 1 according to one embodiment of the present invention. The process begins with an SOI substrate that includes a silicon layer 201 disposed on a buried oxide (BOX) layer (not shown). As is known to those skilled in the art other substrates can be used. As shown in FIG. 2, a hard mask (dielectric) layer 203 is formed on the silicon layer 203. The hard mask layer 203 of this embodiment is silicon nitride (SiN). A polysilicon mandrel layer (not shown) is deposited on the hard mask layer 203 and then patterned and etched. Silicon oxide structures 205 are formed on the vertical sidewalls of the polysilicon structure. Then as shown in FIG. 2, the polysilicon structure is removed, leaving the silicon oxide structures, and the hard mask 203 and silicon layers 201 are etched to form fin structures 202 which are made of silicon and extend upward from the silicon substrate. Other areas, where the fins are not formed, are protected from the etch by photoresist patterned layer 207.

The oxide structures 205 are then removed, and the Shallow trench isolation (STI) process is performed. Shallow trench isolation (STI), also known as a Box Isolation Technique, is an integrated circuit feature which prevents electric current leakage between adjacent semiconductor device components. The STI process uses a pattern of etched trenches in the silicon, deposits one or more dielectric materials 209 (such as silicon dioxide or flowable oxide) to fill the trenches, and removes the excess dielectric 209 using a technique such as chemical-mechanical polishing (CMP).

Figure 3:
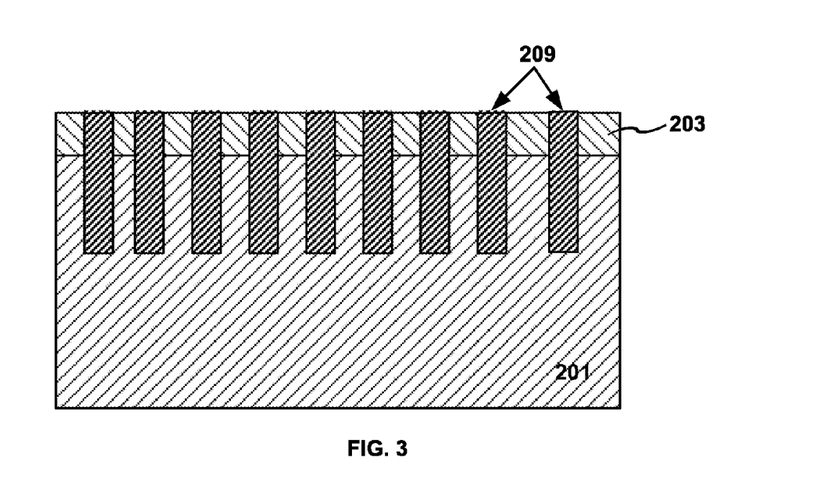
FIG. 3 is a cross-sectional diagram depicting the FinFET structure after the local shallow trench isolation (STI) and chemical mechanical polishing (CMP) processes according to a first embodiment of the invention.

FIG. 3 is a cross-sectional diagram depicting the FinFET structure after the local Shallow trench isolation (STI) and chemical mechanical polishing (CMP) processes according to a first embodiment of the invention. In this drawing, the dielectric material 209 has been finished flush with the hard mask material 203 isolating the fin structures 202 from one another.

Figure 4:
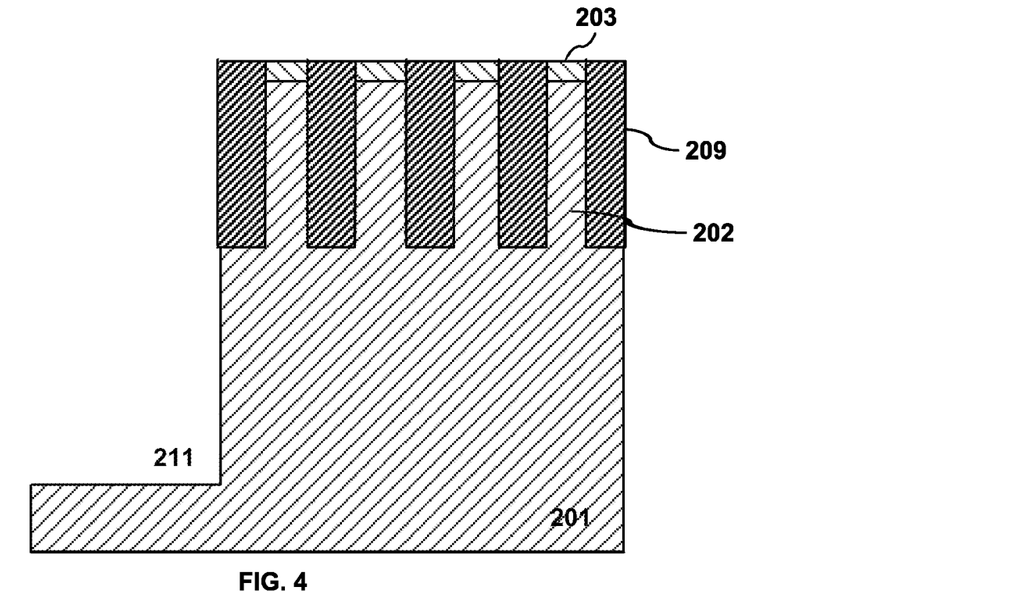
FIG. 4 is a cross-sectional diagram depicting the FinFET structure after the deep STI process according to a first embodiment of the invention.

FIG. 4 is a cross-sectional diagram depicting the FinFET structure after the deep Shallow trench isolation (STI) etch process according to a first embodiment of the invention. The Deep STI process, or deep trench isolation (DTI) is similar to the STI process except that deeper and broader trenches are formed and filled. FIG. 4 shows the result after photolithography and a deep etch which forms a trench 211 in the silicon 201 deeper than the fin structures.

Figure 5:
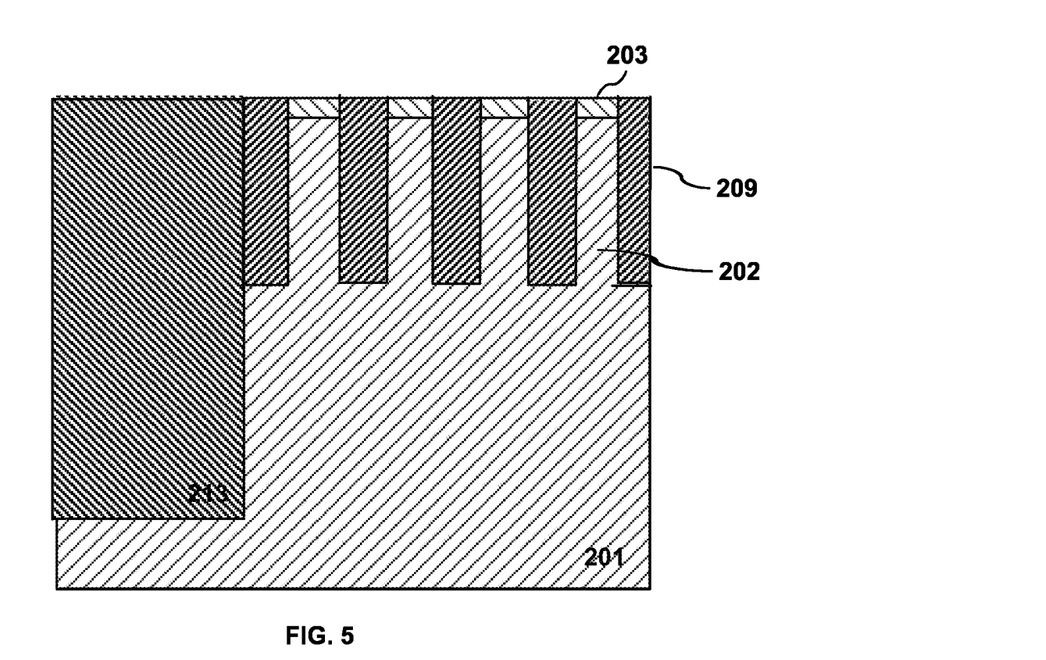
FIG. 5 is a cross-sectional diagram depicting the FinFET structure after the deep STI deposition and chemical mechanical polishing (CMP) processes according to a first embodiment of the invention.

FIG. 5 is a cross-sectional diagram depicting the FinFET structure after the deep STI deposition of the dielectric material 213 and the chemical mechanical polishing (CMP) process according to a first embodiment of the invention. As above, CMP is used to remove the excess dielectric material 213 from areas outside the deep trenches so that the top surface is flush with the hardmask.

Figure 6A:
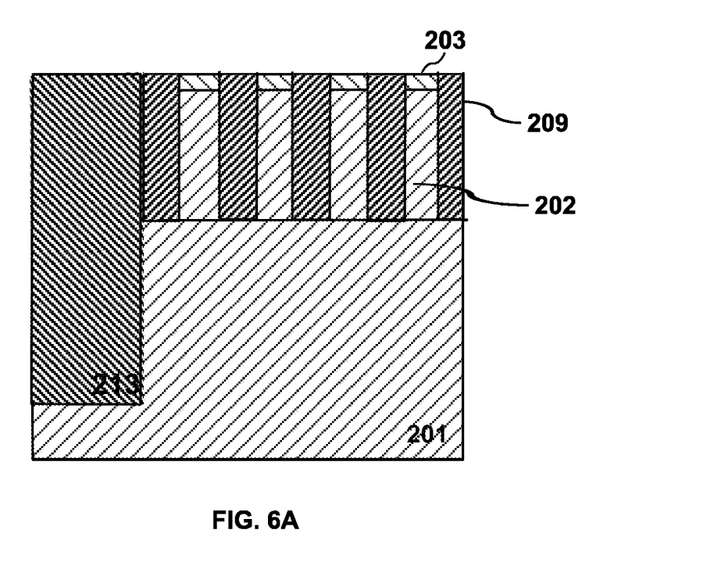
FIGS. 6A and 6B are respectively cross-sectional and perspective diagrams depicting the FinFET structure after patterning and etching to reveal the fin end of the FinFET structure according to a first embodiment of the invention.
Figure 6B:
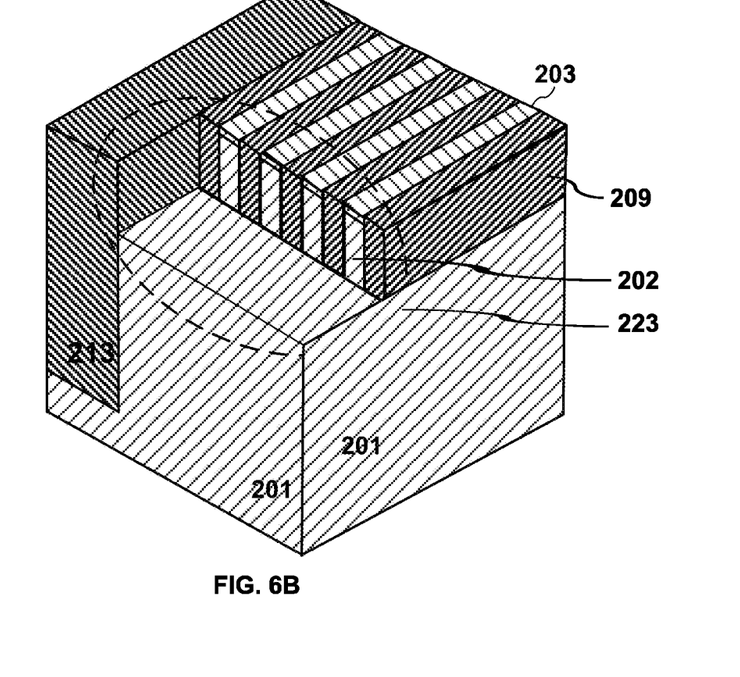

FIG. 6A is a cross-sectional diagram depicting the FinFET structure after patterning with a lithography process and etching to reveal a set of exposed fin ends of the FinFET structure according to a first embodiment of the invention. FIG. 6B is a perspective drawing at the same point in the process. This figure shows "cutting" the fin structure (in one embodiment by the combination of the lithography and etch) so that FinFET pairs or single FinFET transistors are formed from the long fin structures. Although cutting multiple fins is shown in the drawing, in some circuits, only a single fin will be cut producing an exposed fin end at a particular point. Thus, the set of fin ends can be a single fin end in some embodiments of the invention. The fin ends 202 in the well (or trench) area 223 are exposed. The set of exposed fin ends 202 for pFinFETs or logic FinFETs are the locations where excess epitaxial growth is undesired.

Figure 7A:
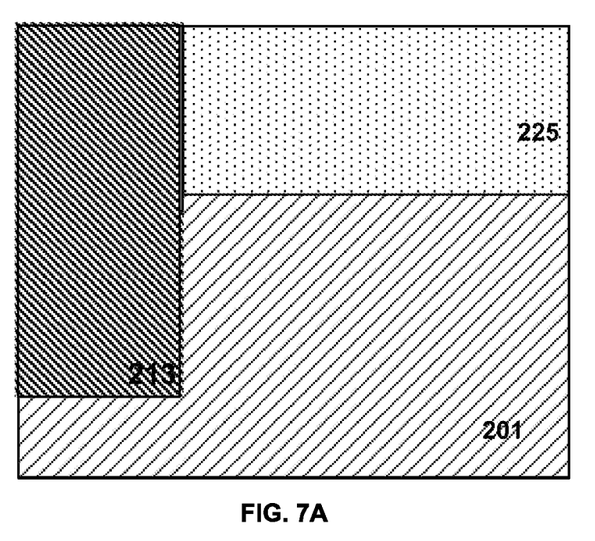
FIGS. 7A and 7B are respectively cross-sectional and perspective diagrams depicting the FinFET structure after sidewall spacer formation to avoid excessive epitaxial growth in the fin end according to a first embodiment of the invention.
Figure 7B:
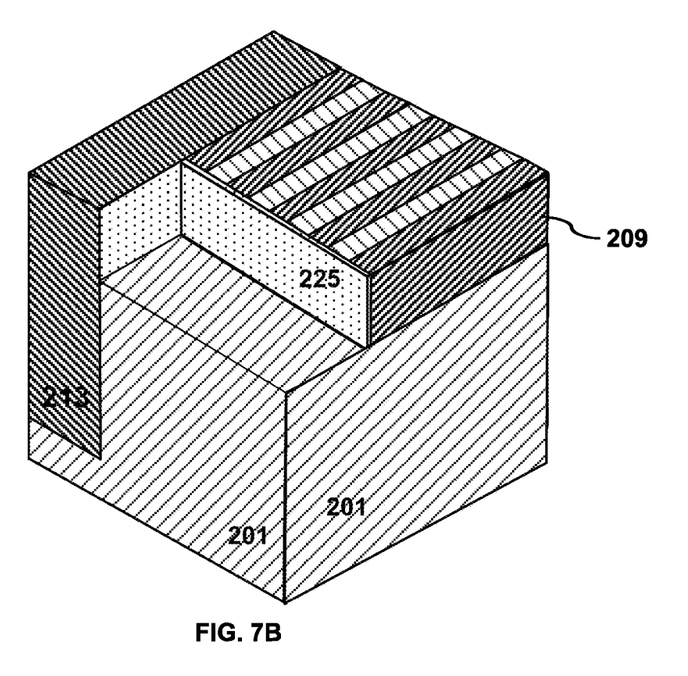

FIG. 7A is a cross-sectional diagram depicting the FinFET structure after sidewall spacer formation to avoid excessive epitaxial growth in the fin end according to a first embodiment of the invention. FIG. 7B is a perspective drawing at the same point in the process. In one preferred embodiment, a silicon nitride (SiN) or silicon oxinitride (SiNO) spacer 225 is formed. In a sidewall spacer process, the spacer is a film layer formed on the underlying features, in this case, the fin ends, the other sidewalls as well as unmasked horizontal areas. Once the sidewall spacer 225 is formed by deposition of the film, etching follows to remove all the film material on the horizontal surfaces, leaving only a layer of the material on the sidewalls as shown in FIGS. 7A and 7B. In some embodiments of the invention, the sidewall material is deposited in a uniform thickness over the structure shown in FIGS. 6A and 6B.

In one preferred embodiment, the SiN or SiNO layer is deposited preferentially on the silicon of the fin ends, but less or even not at all on other structures of the FinFET including the silicon oxide which isolates the fins. Referring back to FIGS. 6A and 6B, in this embodiment, the SiN or SiNO layer is preferentially grown on the exposed fin ends 202 (and top surface of the silicon substrate 201), but not on (or as much on) the dielectric in the shallow trenches 209 or deep trenches 213. In this embodiment, the sidewall spacer is effectively broken up into smaller rectangles disposed at the fin ends, rather than the large rectangle 225 shown in FIGS. 7A and 7B. Where some sidewall material is grown on the dielectric, there will be a large rectangle, however, the sidewall material will be thicker at the fin ends than over the dielectric.

Figure 8A:
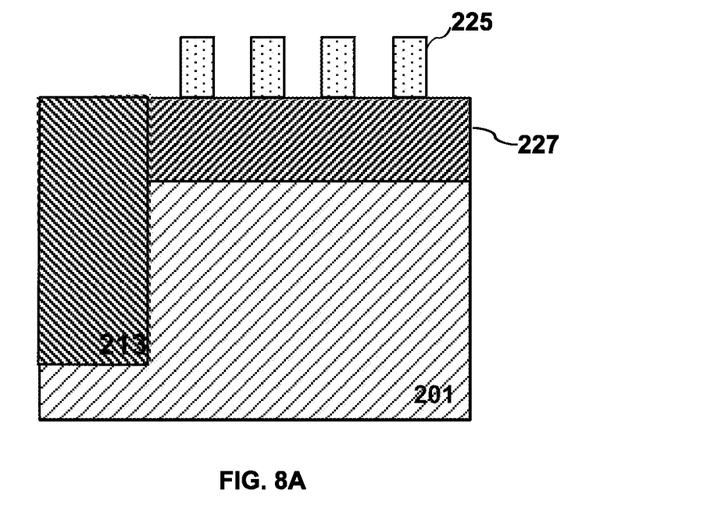
FIGS. 8A and 8B are respectively cross-sectional and perspective diagrams depicting the FinFET structure after an etch process of an oxide layer to reveal the protected fin structure (fin recess) for further processing according to a first embodiment of the invention.
Figure 8B:
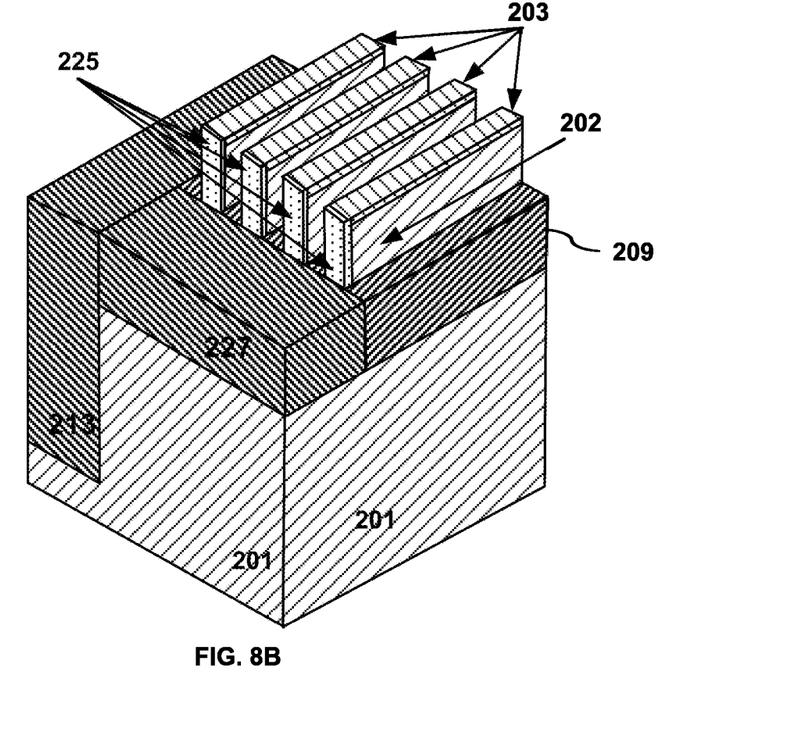

After the sidewall spacer is formed, oxide 227 is deposited in the wells at the fin ends and a CMP process is used to remove excess oxide. Then, in the fin recess process, an etch is used to partially reveal the fins for further processing. FIG. 8A is a cross-sectional diagram depicting the FinFET structure after the etch process of the oxide, reveal the protected fin structure for further processing according to a first embodiment of the invention. FIG. 8B is a perspective drawing at the same point in the process. In one preferred embodiment, the oxide is a flowable oxide.

As shown in FIGS. 8A and 8B, the spacer material 225 is preferably only at the exposed fin ends at this point in the process. The etch used is selective to the dielectric layer 209, e.g., oxide, as compared to the sidewall material, e.g., SiN. Even so, the etch process is used to cleanup the sidewall material between the fins where it is deposited on the dielectric. For those portions of the sidewall material 225 on the dielectric 209, the sidewall material 225 is etched on both sides as the oxide 209 in the trenches is etched away. The etch rate of the spacer material is sufficient to etch away the relatively thin sidewall between the fins. On the other hand, sidewall material 225 at the fin ends 202 is protected on one side by the fin 202, etching more slowly, and thus remains intact at the fin ends. In the embodiment discussed above where the SiN or SiNO was grown preferentially on the silicon as opposed to the oxide, there was less to no spacer material to be etched away over the oxide 209, so in this embodiment, it would be easier than the full sidewall spacer embodiment from a cleanup perspective. The spacer material 225 at the fin ends prevents epitaxial growth from that portion of the fin, while allowing the sidewalls of the fin to provide the "seed" for epitaxial growth for the source and drain.

Figure 9A:
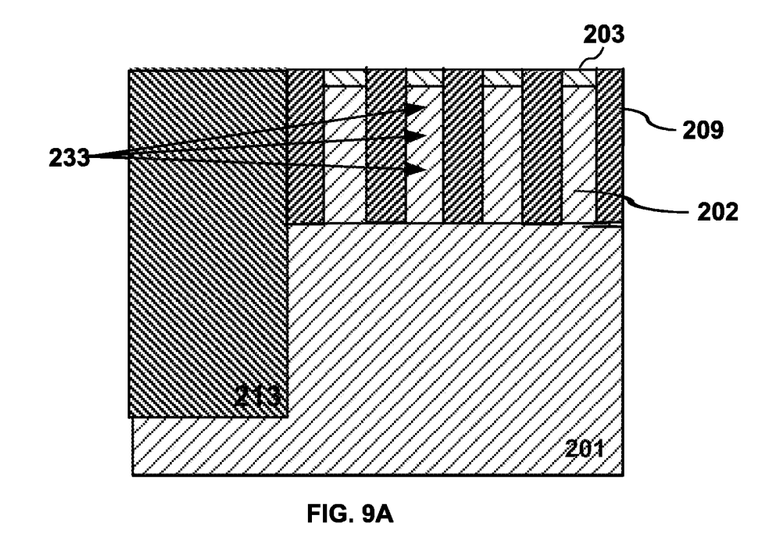
FIGS. 9A and 9B are respectively cross-sectional and perspective diagrams depicting the FinFET structure after plasma nitridation and high dose implantation to avoid excessive epitaxial growth in the fin end according to a second embodiment of the invention.
Figure 9B:
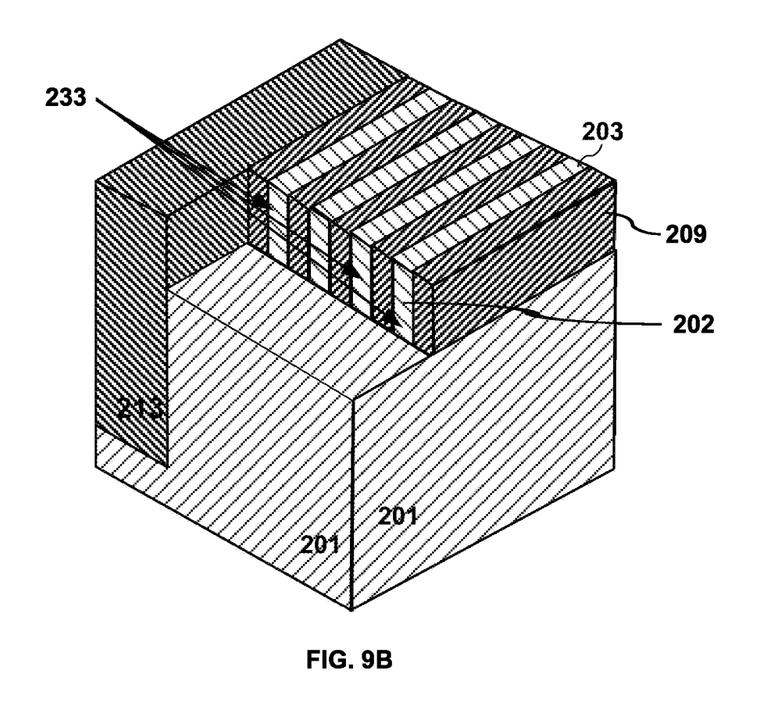

In FIG. 9A, a second embodiment of the invention is shown. FIG. 9B is a perspective drawing at the same point in the process. The processing for the second invention is similar to that shown in FIGS. 2-6 for the first invention. Then after the fins are cut, by photo lithography and etch as shown FIGS. 9A and 9B, the exposed fin ends 202 of the FinFET structure are exposed to plasma nitridation and/or high dose implantation (portrayed as arrows 233) to create an inhibitory layer which inhibits excessive epitaxial growth at the fin ends. Different embodiments of the invention will use either plasma nitridation or high dose implantation; some embodiments of the invention can use both processes in combination. A plasma nitridation process will form a SiN layer on the exposed fin tip to prevent epitaxial growth. The high dose implantation can use zirconium (Zr) or argon (Ar) ions to create a thin amorphous silicon layer at the fin end 202. Those skilled in the art will recognize that other ions can be used in the implantation process. Amorphous silicon is not as good a "seed" as crystalline silicon, so the amorphous silicon layer will slow down the epitaxial growth at the fin ends.

In the second embodiment, after the plasma nitridation or high dose implantation, the remaining processing is similar to that depicted in FIG. 8, namely oxide is deposited in the wells at the fin ends and a CMP process is used to remove excess oxide. Then, an etch is used to partially reveal the fins for further processing.

The invention has several benefits over the prior art. By preventing epitaxial growth at the fin ends of a FinFET, the dimensions of the integrated circuit can be reduced as the spacing between the active PU FinFETs is not as much of a limiting factor. In addition, the yield of SRAMs built according to the prevent invention is improved.

While only one or a limited number of features are illustrated in the drawings, those ordinarily skilled in the art would understand that many different types features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for preventing epitaxial growth in a semiconductor device comprising:
   cutting fins of FinFET structure to form a set of exposed fin ends;
   depositing a conformal layer of sidewall spacer material over the FinFET structure;
   performing an etch to remove the conformal layer of sidewall spacer material on horizontal surfaces leaving sidewall spacers on vertical portions of the FinFET structure including the set of exposed fin ends, the step of performing an etch producing a set of spacer covered fin ends;
   depositing a layer of silicon oxide in a well area over the conformal layer of sidewall spacer material;
   performing a chemical mechanical polishing step to remove excess silicon oxide;
   etching oxide areas around the FinFET structure to reveal the fins for further processing; and
   wherein the set of sidewall spacers prevent epitaxial growth at the set of spacer covered fin ends.

2. The method as recited in claim 1, further comprising preferentially depositing a layer of sidewall spacer material over the set of exposed fin ends as compared to dielectric areas of the FinFET structure.

3. The method as recited in claim 2, wherein the layer of sidewall spacer material is SiNO.

4. The method as recited in claim 2, wherein the conformal layer of sidewall spacer material is SiN.

5. The method as recited in claim 1, wherein the FinFET structure is incorporated in a set of FinFET devices.

6. The method as recited in claim 5, wherein the set of FinFET devices is arranged in an SRAM device.

7. A method for preventing epitaxial growth in a semiconductor device comprising:
   cutting fins of a FinFET structure to form a set of exposed fin ends;
   performing a high dose implantation to the set of exposed fin ends, the step of performing the high dose implantation forming a set of amorphous silicon layer covered fin ends; and
   wherein the amorphous silicon layers prevent epitaxial growth at the set of amorphous silicon layer covered fin ends.

8. The method as recited in claim 7, wherein the amorphous silicon is formed by a combination of a plasma nitridation process and a high dose implantation process.

9. The method as recited in claim 8, wherein the FinFET structure is incorporated in a set of FinFET devices.

10. The method as recited in claim 9, wherein the set of FinFET devices is arranged in an SRAM device.

11. A method for preventing epitaxial growth in a semiconductor device comprising:
    cutting a set of fins of a FinFET structure to form a set of exposed fin ends, each fin of the set of fins having an exposed fin end and a pair of sidewalls, the FinFET structure further comprising dielectric material disposed along the sidewalls of the set of fins, wherein cutting the set of fins creates a vertical, planar surface comprised of the set of exposed fin ends and dielectric material on each side of an exposed fin end;
    depositing a conformal layer of sidewall spacer material over the FinFET structure;
    forming a set of sidewall spacers on the set of exposed fin ends in an etch step by etching the dielectric material to reveal the sidewalls of the fins for epitaxial growth and etching spacer material on vertical portions of the FinFET structure composed of the dielectric material while spacer material on the set of fin ends is retained; and
    wherein the set of sidewall spacers prevent epitaxial growth at the set of spacer covered fin ends.

12. The method as recited in claim 11, wherein the FinFET structure is incorporated in a set of FinFET devices.

13. The method as recited in claim 12, wherein the set of FinFET devices is arranged in an SRAM device.

14. The method as recited in claim 11, wherein the set of sidewall spacers is comprised of SiN.

15. The method as recited in claim 11, further comprising performing a shallow trench isolation process to isolate respective fins from others of the set of fins with a dielectric material.

16. The method as recited in claim 11, further comprising preferentially depositing the conformal layer of sidewall spacer material over the set of exposed fin ends as compared to dielectric areas of the FinFET structure.

* * * * *